United States Patent
Ishii et al.

(10) Patent No.: US 6,646,224 B2
(45) Date of Patent: Nov. 11, 2003

(54) PLASMA-ASSISTED PROCESSING SYSTEM AND PLASMA-ASSISTED PROCESSING METHOD

(75) Inventors: Nobuo Ishii, Osaka-fu (JP); Yasuyoshi Yasaka, 5-107, Sudome, Kobata, Uji-shi, Kyoto-fu (JP); Makoto Ando, 1-1-I-312, Ogura, Saiwai-Ku, Kawasaki-Shi, Kanagawa-ken (JP); Naohisa Goto, 2-8-1, Shiroyamate, Hachioji-shi, Tokyo-to (JP)

(73) Assignees: Tokyo Electron Limited, Tokyo-to (JP); Yasuyoshi Yasaka, Kyoto-fu (JP); Makoto Ando, Kanagawa-ken (JP); Naohisa Goto, Tokyo-to (JP)

( * ) Notice: Subject to any disclaimer, the term of this patent is extended or adjusted under 35 U.S.C. 154(b) by 0 days.

(21) Appl. No.: 10/356,639

(22) Filed: Feb. 3, 2003

(65) Prior Publication Data

US 2003/0150846 A1 Aug. 14, 2003

Related U.S. Application Data

(62) Division of application No. 09/595,476, filed on Jun. 16, 2000, now Pat. No. 6,528,752.

(30) Foreign Application Priority Data

Jun. 18, 1999 (JP) ............................................ 11-173066

(51) Int. Cl.$^7$ ............................................... B23K 10/00
(52) U.S. Cl. ............................ 219/121.43; 219/121.54; 118/723 MW
(58) Field of Search ....................... 219/121.43, 121.54, 219/121.48, 745–750; 156/345.41; 118/723 MW, 723 AN, 723 IR, 723 VE, 50.1; 373/18, 25; 315/111.81, 111.21; 427/8; 204/298.01, 298.23

(56) References Cited

U.S. PATENT DOCUMENTS

| 4,866,346 A | * | 9/1989 | Gaudreau et al. ....... 315/111.21 |
| 4,940,015 A | | 7/1990 | Kobashi et al. |
| 5,311,103 A | | 5/1994 | Asmussen et al. |
| 5,387,288 A | | 2/1995 | Shatas |
| 6,132,550 A | | 10/2000 | Shiomi |
| 6,311,638 B1 | * | 11/2001 | Ishii et al. .......... 118/723 MW |

* cited by examiner

Primary Examiner—Quang T. Van
(74) Attorney, Agent, or Firm—Finnegan, Henderson, Farabow, Garrett & Dunner LLP

(57) ABSTRACT

A plasma-assisted processing system has a lifting mechanism capable of vertically moving a microwave power unit and a waveguide to adjust the level of a planar slot antenna disposed on an expanded lower end part of the waveguide. A space extending under the antenna is surrounded by a shielding member. An optical sensor having an array of photosensors is disposed on the outer side of a window formed in the side wall of a vacuum vessel to monitor the lower limit level of a cease region for a plasma (cease level). An ideal distance between the cease level and the antenna is determined beforehand and the level of the antenna is adjusted on the basis of a measured cease level so that the antenna is spaced the ideal distance apart from the cease level. Since the difference between the cease level and a level X0 for the cutoff density of an X-wave is fixed, the level X0 may be monitored instead of the cease level.

3 Claims, 11 Drawing Sheets

| | PRESSURE (mTorr) | MICROWAVE POWER (kw) | LEVEL Xo (mm) |
|---|---|---|---|
| 1 | 20 | 0.6 | 11 |
| 2 | 20 | 0.8 | 9.4 |
| 3 | 20 | 1.0 | 9.2 |
| 4 | 30 | 0.6 | 10.8 |
| 5 | 30 | 1.0 | 8.0 |
| 6 | 30 | 2.0 | 6.7 |
| 7 | 50 | 5.0 | 5.3 |

PLASMA-ASSISTED PROCESSING SYSTEM AND PLASMA-ASSISTED PROCESSING METHOD

This is a divisional of application Ser. No. 09/595,476, filed Jun. 16, 2000 now U.S. Pat. No. 6,528,752, which is incorporated herein by reference.

BACKGROUND OF THE INVENTION

1. Field of the Invention

The present invention relates to a plasma-assisted processing system and a plasma-assisted processing method that produce a plasma by using the energy of a high-frequency wave, such as a microwave, and use the plasma for processing a substrate, such as a semiconductor wafer.

2. Description of the Related Art

A semiconductor device manufacturing process includes a step of processing a semiconductor wafer (hereinafter referred to simply as "wafer") by using a plasma FIG. 16 shows a known microwave plasma-assisted processing system that carries out a plasma-assisted process. As shown in FIG. 16, the microwave plasma-assisted processing system has a vacuum vessel 9 provided with a stage 91 for supporting a wafer W thereon, a planar slot antenna 92 disposed in a ceiling region of the vacuum vessel 9, a microwave power unit 93, a coaxial waveguide 94 provided with a shaft 94a and connected to the microwave source 93 and the vacuum vessel 9, a microwave transmitting plate 95 of quartz, and a gas supply unit 96. A microwave generated by the microwave power unit 93 is guided through the waveguide 94, the antenna 92 and the microwave transmitting plate 95 into the vacuum vessel 9, a process gas supplied by the gas supply unit 96 into the vacuum vessel 9 is ionized by the microwave to produce a plasma, and the plasma is used for forming a film on the wafer W or for etching a film formed on the wafer W.

A plasma is a complicated combination of electrical, physical and chemical phenomena and its mechanism has many points which have not yet been elucidated. As matters stand, the dependence of the condition of a plasma on process conditions has not been definitely elucidated. Therefore, even if a highly uniform plasma can be produced under certain process conditions including pressure and power of a microwave, sometimes, the uniformity of the plasma is deteriorated under other process conditions.

The uniformity of a plasma is reflected directly on the uniformity of a film thickness or the uniformity of etch rate. Since the recent semiconductor devices are miniaturized and are provided with thin films, the yield of semiconductor devices is greatly dependent on the uniformity of the plasma. Accordingly, the development of techniques capable of producing a highly uniform plasma regardless of process conditions has been desired.

SUMMARY OF THE INVENTION

It is an object of the present invention to provide a plasma-assisted processing system and a plasma-assisted processing method capable of producing a highly uniform plasma and of processing a substrate in a high intrasurface uniformity.

According to a first aspect of the present invention, a plasma-assisted processing system comprising a vacuum vessel internally provided with a stage, a high-frequency wave transmitting plate attached to the vacuum vessel, a planar antenna disposed opposite to the high-frequency wave transmitting plate, and a high-frequency power unit that sends a high-frequency wave for producing a plasma to the antenna, and capable of propagating a high-frequency wave for producing a plasma through the antenna and the high-frequency wave transmitting plate into the vacuum vessel, of producing a plasma by ionizing a processing gas supplied into the vacuum vessel by the energy of the high-frequency wave and of processing a substrate mounted on the stage in the vacuum vessel by using the plasma; comprises: a lifting mechanism that moves the antenna vertically relative to the vacuum vessel; an electromagnetic shielding member surrounding a region between the antenna and the high-frequency wave transmitting plate; a level estimating unit that estimates a level of high-frequency wave cutoff density formed between the high-frequency wave transmitting plate and a plasma producing region; and a controller that controls the lifting mechanism to adjust the level of the antenna so that a cavity of a proper size for the high-frequency wave is formed between the antenna and the level of a cutoff density for the high-frequency wave for producing a plasma.

Since the lower end of the cavity for the high-frequency wave can be known, the level of the antenna can be properly adjusted on the basis of the result of operation of the level estimating unit by determining the proper size of the cavity beforehand.

According to a second aspect of the present invention, the level estimating unit includes a transparent plate covering an opening formed in a side wall of the vacuum vessel, and a cease region detecting unit capable of optically detecting a lower limit level of a cease region in which a plasma produced in the plasma producing region ceases between the high-frequency wave transmitting plate and a region in which the plasma is luminescent, and the level of the cutoff density is estimated on the basis of the detected lower limit level for the cease region.

According to a third aspect of the present invention, the level estimating unit includes a high-frequency wave radiating unit that delivers a detecting high-frequency wave from above the plasma to the plasma, and a high-frequency wave receiving unit that receives the detecting high-frequency wave delivered to and reflected by the plasma, a level of the cutoff density for the detecting high-frequency wave is determined on the basis of a position of the reflected high-frequency wave on the high-frequency wave receiving unit, and a level of the cutoff density for the plasma producing high-frequency wave is estimated on the basis of the level of the cutoff density for the detecting high-frequency wave.

Although the level of a cutoff density for the plasma producing high-frequency wave and the lower limit level of the cease region are different from each other, the difference between those levels can be regarded as substantially fixed. Therefore, those results of detection can be used in substitution for the level of a cutoff density for the plasma producing high-frequency wave. Estimation of the level of a cutoff density for the high-frequency wave includes the use of the detected lower limit level of the cease region of the plasma and the detected level of a cutoff density for the detecting high-frequency wave as substitutes, and includes the estimation of the level of a cutoff density for the plasma producing high-frequency wave on the basis of a predetermined algorithm.

According to a fourth aspect of the present invention, a plasma-assisted processing system comprising a vacuum vessel internally provided with a stage, a high-frequency wave transmitting plate attached to the vacuum vessel, a planar antenna disposed opposite to the high-frequency wave transmitting plate, and a high-frequency power unit that delivers a high-frequency wave for producing a plasma to the antenna, and capable of propagating a high-frequency wave for producing a plasma through the antenna and the high-frequency wave transmitting plate into the vacuum vessel, of producing a plasma by ionizing a processing gas supplied into the vacuum vessel by the energy of the high-frequency wave and of processing a substrate mounted on the stage in the vacuum vessel by using the plasma; comprises: a lifting mechanism that moves the antenna vertically relative to the vacuum vessel; an electromagnetic shielding member surrounding a region between the antenna and the high-frequency wave transmitting plate; a storage unit that stores set antenna levels for recipes for plasma-assisted process; and a controller that reads a level of the antenna for a selected recipe from the storage unit and controls the lifting mechanism to adjust the level of the antenna.

According to a fifth aspect of the present invention a plasma-assisted processing method comprises the steps of: propagating a plasma producing high-frequency wave delivered by a high-frequency power unit through a planar antenna and a high-frequency wave transmitting plate into a vacuum vessel; producing a plasma by ionizing a processing gas supplied into the vacuum vessel by the energy of the high-frequency wave; and processing a substrate supported on a stage disposed in the vacuum vessel; wherein the substrate is processed by a plasma-assisted process after adjusting the level of the antenna relative to the vacuum vessel so that a cavity region of a proper size for the high-frequency wave is formed between the antenna and a level of a cutoff density for the high-frequency wave in the vacuum vessel.

DESCRIPTION OF THE PREFERRED EMBODIMENT

Figure 16:
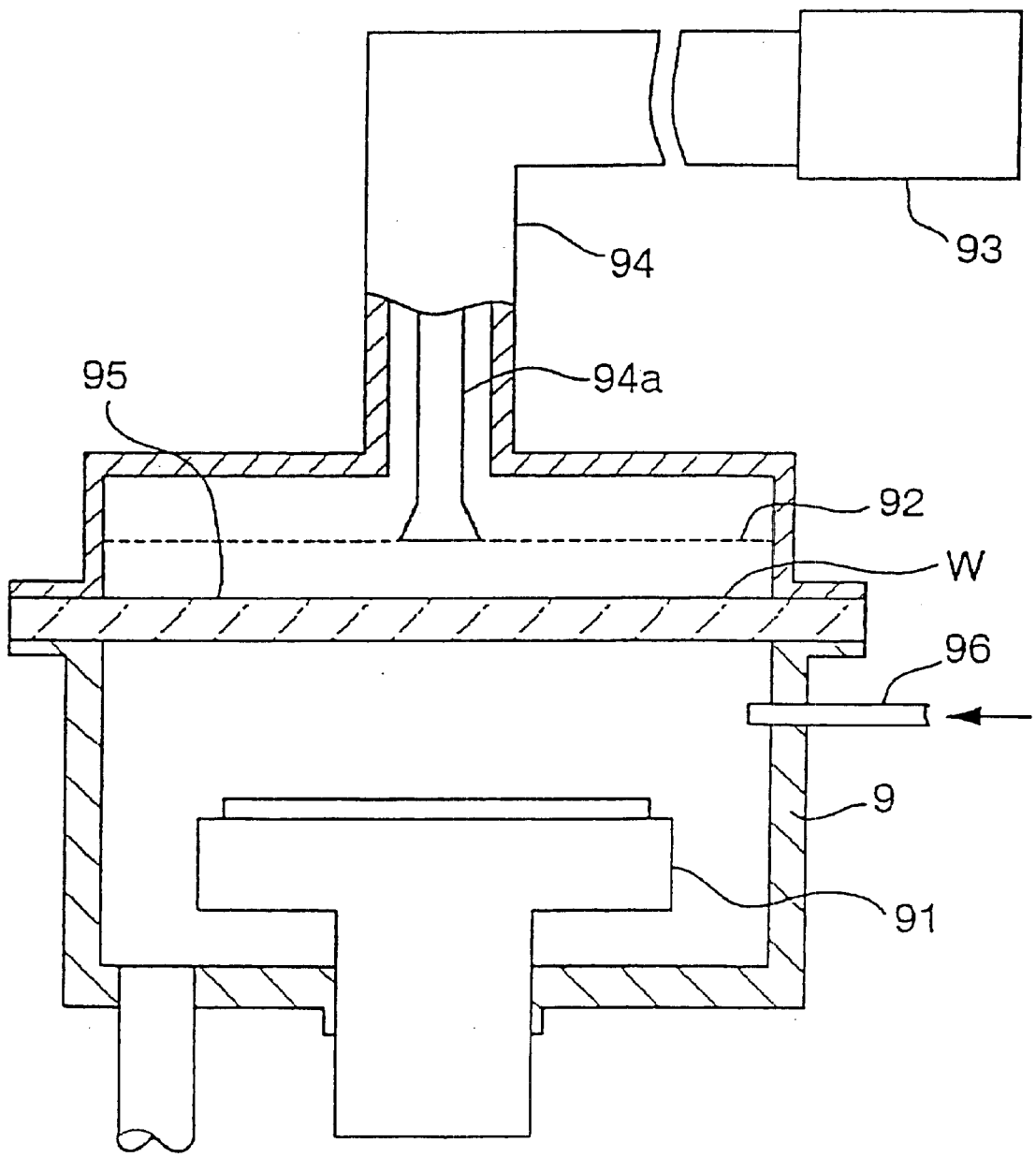
FIG. 16 is a schematic longitudinal sectional view of a conventional plasma-assisted processing system.

Matters on the basis of which plasma-assisted processing systems according to the present invention have been designed will be described prior to the description of plasma-assisted processing systems embodying the present invention. A plasma produced in the vacuum vessel 9 included in the conventional plasma-assisted processing system shown in FIG. 16 was observed by using a CCD camera embedded in the stage 91 disposed in the vacuum vessel 9 and having an upper part formed of quartz. Argon gas was supplied from the gas supply unit 96 into the vacuum vessel 9 and a 2.45 GHz microwave was propagated from the microwave power unit 93 into the vacuum vessel 9 to produce a plasma by ionizing the argon gas. The power of the microwave and the pressure in the vacuum vessel 9 were varied and the condition of the plasma was observed. The brightness of the plasma was uniform under some conditions and was irregular under other conditions.

Figures 1A, 1B:
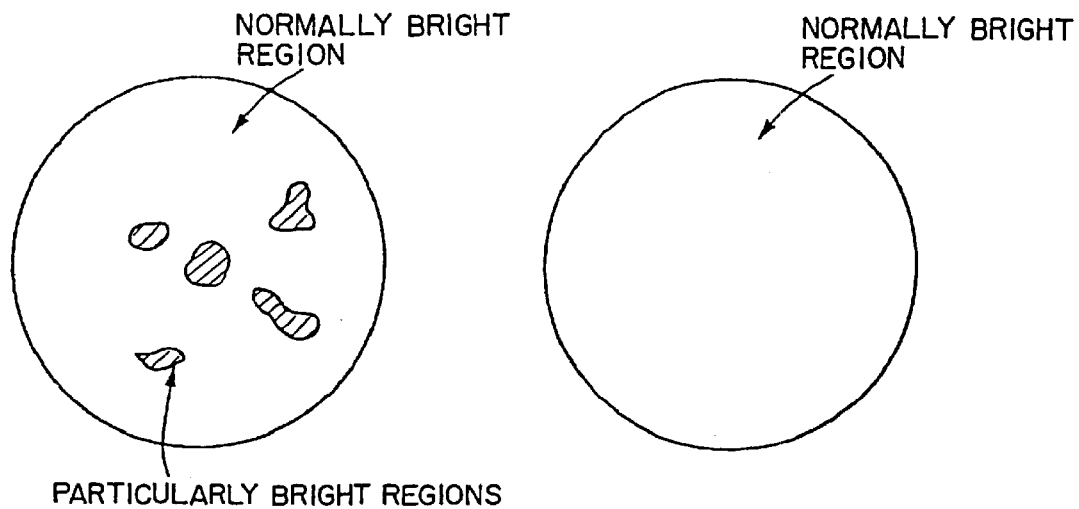
FIGS. 1A and 1B are views of assistance in explaining results of observation of a plasma.

FIGS. 1A and 1B are views showing images of plasmas taken by the CCD camera. FIG. 1A shows an irregular plasma having particularly bright regions and FIG. 1B shows a uniform plasma having uniform brightness.

Table 1 shows process conditions and the condition of plasmas.

TABLE 1

| | Pressure (mtorr) | Microwave power (kW) | Condition of plasma |
| --- | --- | --- | --- |
| A | 50 | 2 | Irregular brightness |
| B | 100 | 2 | Uniform brightness |
| C | 50 | 5 | Uniform brightness |

Figure 2:
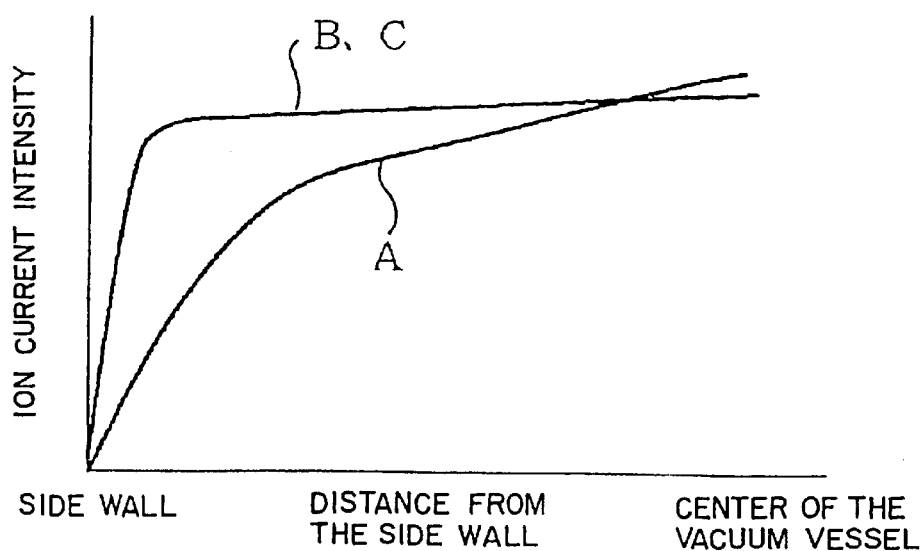
FIG. 2 is a graph showing an ion current intensity distribution in a plasma.

Ion current intensity distribution in the vacuum vessel 9 with respect to radial directions was measured under the foregoing process conditions. Measured results are shown in FIG. 2. Under the process condition A, ion current intensity increases from a position on the wall of the vacuum vessel 9 toward the center of the same. Ion current intensity distributions under the process conditions B and C are substantially the same; ion current intensity under the process conditions B and C is substantially on the same level between the wall of the vacuum vessel 9 and the center of the same. In FIG. 2, the ion current intensity distributions under the process conditions B and C are indicated by a single curve for the sake of convenience.

Figure 3:
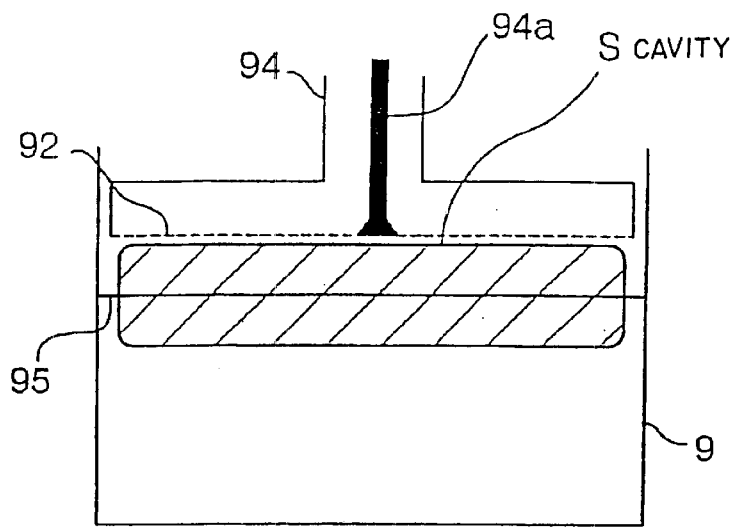
FIG. 3 is a typical view of a cavity for a microwave.

Ion current intensity is dependent on the electron density of the plasma. The size of a plasma cease region, i.e., a region near the wall in which the plasma is not luminescent, is dependent on electron density. The inventors of the present invention noticed a fact that the size of the plasma cease region is related with the size of a microwave cavity extending over the plasma. The cavity is formed between the antenna 92 and a position of a cutoff density for the microwave. In FIG. 3 shaded region S is a cavity.

Figure 4:
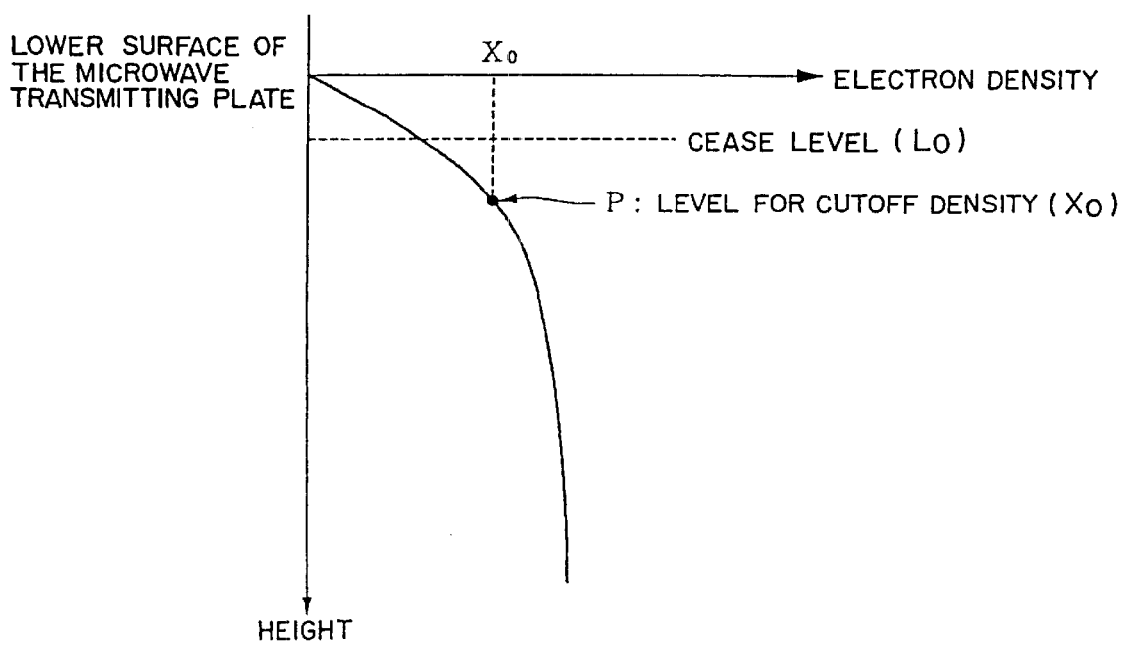
FIG. 4 is a graph showing the variation of electron density with the position of a microwave in a vacuum vessel relative to a microwave transmitting plate.
Figures 5, 6:
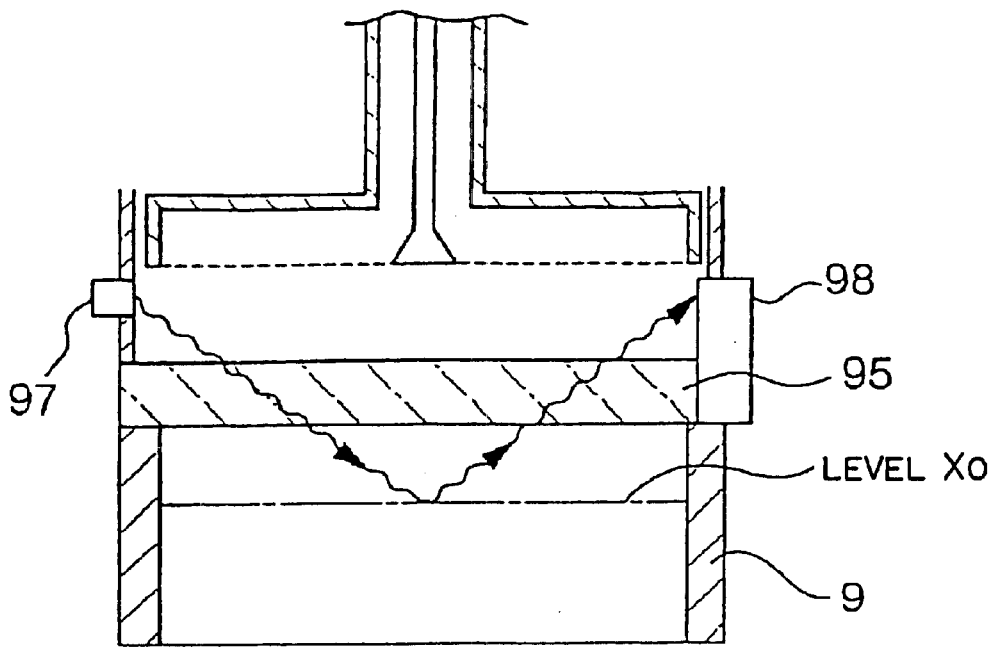
FIG. 5 is a typical view of assistance in explaining the reflection of a microwave at a position of a cutoff density for an X-wave.
FIG. 6 is a table of assistance in explaining the relation between process conditions and position of a cutoff density for an X-wave.

FIG. 4 is a graph showing the variation of electron density with distance from the lower surface of the microwave transmitting plate 95 in the vacuum vessel 9. A cutoff density X0 for the plasma producing microwave is at a position at a certain distance from the microwave transmitting plate 95. As shown in FIG. 5, on the level of the cutoff density X0 (hereinafter referred to as "level X0"), the plasma producing microwave falling from above the level X0 is reflected. A portion of the plasma near the wall of the vacuum vessel 9 is in a cease region in which the plasma is not luminescent. The level X0 is below a level L0 of the lower limit of the cease region (hereinafter referred to as "cease level L0"), and the difference between those levels is substantially constant.

Since the microwave is reflected on the level X0, the level X0 can be determined, for example, by radiating an electromagnetic wave obliquely downward toward, for example, a central region of the vacuum vessel 9 by an electromagnetic wave radiator 97 disposed on an electromagnetic shielding member extending between the antenna 92 and the microwave transmitting plate 95 as shown in FIG. 5, receiving the reflected electromagnetic wave by an electromagnetic wave receiver 98, and calculating the level of a position from which the electromagnetic wave is reflected on the basis of a position at which the reflected electromagnetic wave falls on the electromagnetic wave receiver 98.

When a microwave of the same frequency as that of the plasma producing microwave is radiated by the electromagnetic wave radiator 97, the electromagnetic wave receiver is unable to discriminate between the microwave radiated by the electromagnetic wave radiator 97 and the plasma producing microwave radiated by the antenna 92. Therefore, a measuring microwave of a frequency different from that of the plasma producing microwave is radiated by the electromagnetic wave radiator 97. The level of a cutoff density for the measuring microwave (hereinafter referred to as "level X1") can be determined. The relation between the Levels X0 and X1 is dependent on the frequency difference and could be expressed by: $X1=X0+\alpha$, where "=" signifies approximately equal. Since $\alpha$ is the difference between the levels X1 and X0, $\alpha$ can be regarded as substantially constant, the detected level X1 can be used in substitution for the level X0 without any problem. The frequency of the measuring microwave is, for example, in the range of several gigahertz to about 30 GHz. The lower limit frequency, when considered in connection with the shape of the vacuum chamber, is on the order of several gigahertz. Since frequency is proportional to the square root of cutoff density (electron density), the upper limit frequency is on the order of 30 GHz at the highest. The electromagnetic wave receiver 98 may comprise a plurality of wave receiving elements in a vertical arrangement and may estimate the position of the reflected electromagnetic wave on the basis of the position of the wave receiving element that receives the electromagnetic wave or may comprise a single wave receiving element that is moved vertically for scanning and may estimate the position of the reflected electromagnetic wave from a position where the scanning wave receiving element receives the reflected electromagnetic wave. Since the interval between the level X0 and the cease level, the cease level may be detected optically and may be used in substitution for the level X0.

The positions of the X0 under different process conditions were measured. Measured results are shown in FIG. 6, in which "Level X0" signifies distance from the lower surface of the microwave transmitting plate 95 to the level X0. As obvious from data shown in FIG. 6, the level X0 approaches the microwave transmitting plate 95 as the power of the microwave increases, and the level X0 approaches the microwave transmitting plate 95 as the pressure increases.

Since the size of the cavity for the microwave and the condition of the plasma are thus dependent on the process conditions, the condition of the plasma is connected with the size of the cavity. Therefore, it is considered that a uniform plasma having uniform brightness can be produced regardless of process conditions by properly regulating the size of the cavity. More specifically, A cavity of a proper size is formed by determining a proper size of a cavity beforehand, detecting the position of the level X0 when carrying out a process, and adjusting the height of the antenna 92. Since the position of the level X0 changes scarcely when the height of the antenna 92 is changed under some process conditions, adjustment is made so that distance between the antenna 92 and the level X0 coincides with the vertical length of the proper cavity.

Figure 7:
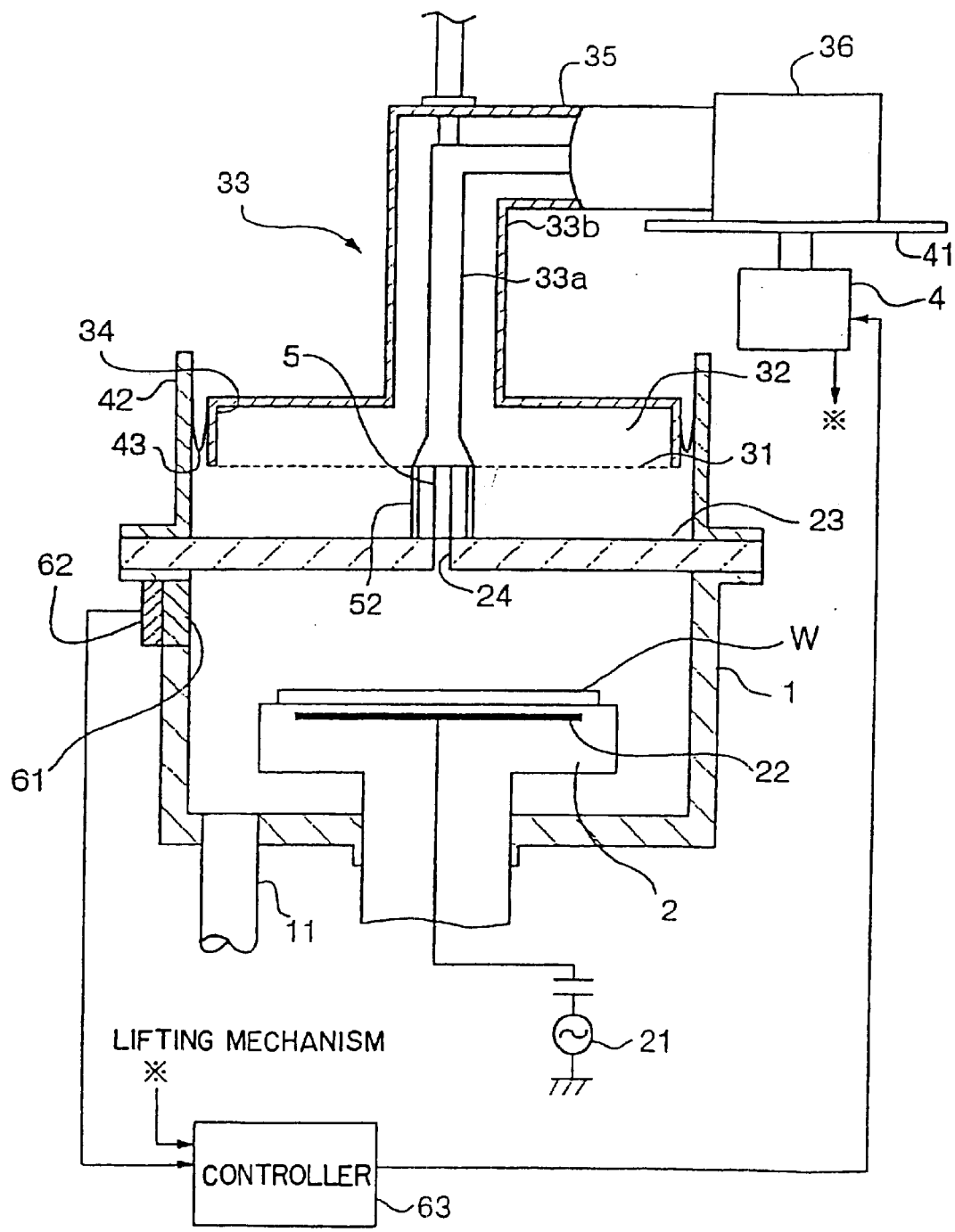
FIG. 7 is a schematic longitudinal sectional view of a plasma-assisted processing system in a first embodiment according to the present invention.

A plasma-assisted processing system according to the present invention shown in FIG. 7 which will be described hereinafter is an embodiment of the foregoing techniques. Referring to FIG. 7, the plasma-assisted processing system has a vacuum vessel 1 of, for example, a cylindrical shape, and a stage 2 disposed in the vacuum vessel 1 to support a wafer W, i.e., a substrate, thereon. A discharge pipe 11 through which the vacuum vessel 1 is evacuated is connected to the bottom wall of the vacuum vessel 1. An electrode 22 is embedded in the stage 2 and is connected to a high-frequency bias power unit 21 to apply, for example, a 13.56 MHz bias voltage to the stage 2. The stage 2 is provided with a temperature adjusting unit, not shown, to adjust the temperature of the wafer W to a predetermined temperature. An open end of the vacuum vessel 1 is covered with a microwave transmitting plate 23 of a dielectric material, such as quartz. A planar antenna 32 provided with a plurality of slots 31 is disposed opposite to the microwave transmitting plate 23.

A coaxial waveguide 33 has an inner pipe 33a and an outer pipe 33b coaxially surrounding the inner pipe 33a. One end of the inner pipe 33a of the coaxial waveguide 33 is connected to a central part of the antenna 32. A lower end part of the outer pipe 33b is expanded radially and extended axially downward to form a flat, cylindrical part 34. A rectangular waveguide 35 has one end connected to the side surface of one end of the coaxial waveguide 33 remote from the antenna 32, and the other end connected through an impedance matching unit, not shown, to a microwave power unit 36. The microwave power unit 36 is held on a holding table 41 which can be vertically moved by a lifting mechanism 4. The microwave power unit 36 and the waveguides 33 and 35 can be vertically moved by the lifting mechanism 4. The lifting mechanism 4 may be, for example, a motor-driven jack or a lifting device employing a ball screw and a pneumatic cylinder actuator.

An electromagnetic shielding cylinder 42 of a metal is set up on a peripheral part of the microwave transmitting plate 23. An annular plate spring 43 having a U-shaped cross section is fitted in an annular space between the inner surface of the shielding cylinder 42 and the outer surface of the expanded part 34 of the waveguide 33. Since the waveguide 33 can be vertically movable as mentioned above, the plate spring 43 separates a space under the antenna 32 from a space around the waveguide 33 and guides the expanded part 34.

Figure 8:
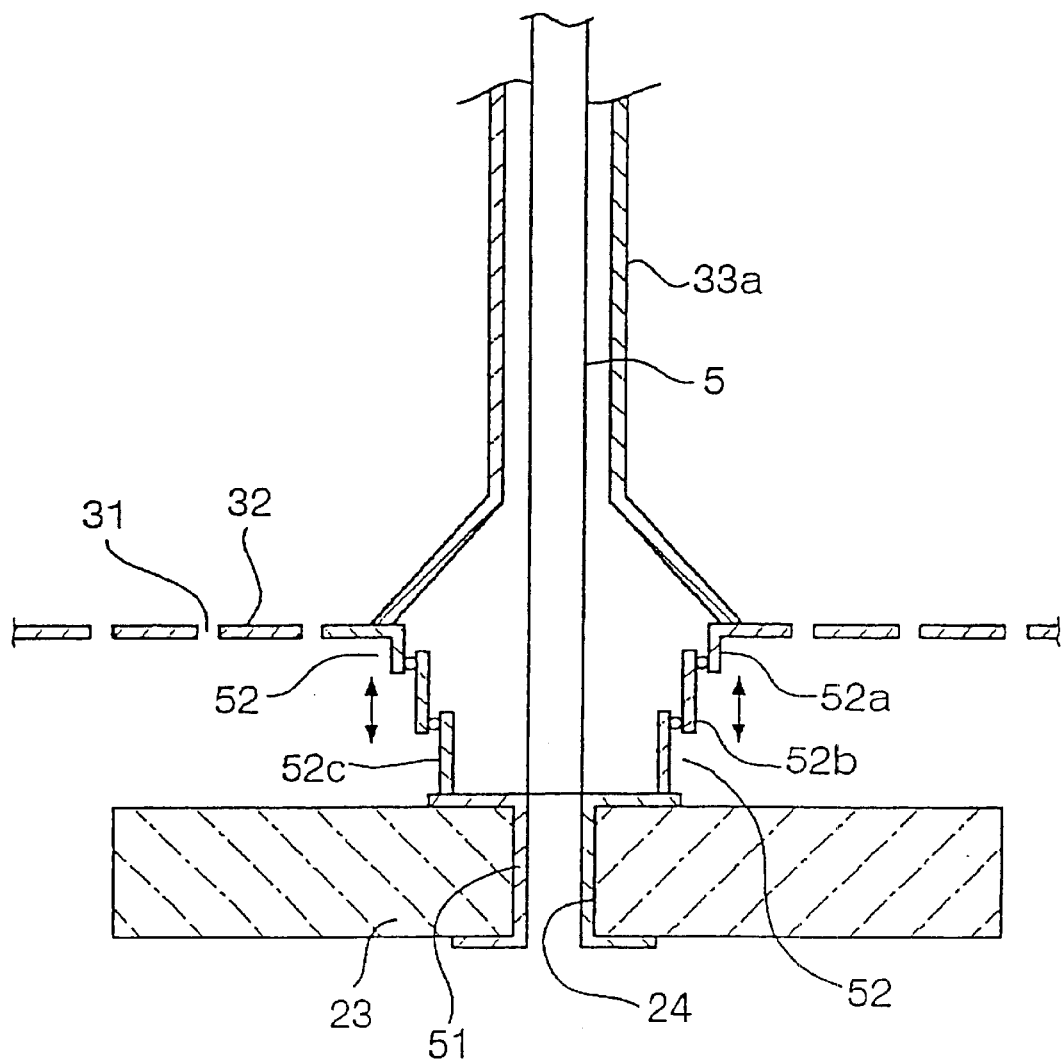
FIG. 8 is an enlarged sectional view of a portion of the plasma-assisted processing system shown in FIG. 7.

The inner pipe 34 of the waveguide 33 is cylindrical. A gas supply pipe 5 is extended through the inner pipe 34. As shown in FIG. 8, an opening 24 is formed in a central part of the microwave transmitting plate 23 and a metal ring 51 is fitted in the opening 24. The free end of the gas supply pipe 5 is welded to a flange formed on the metal ring 51. A telescopic electromagnetic shielding device 52 is disposed below the inner pipe 33a so as to surround the gas supply pipe 5. The electromagnetic shielding member 52 is formed by sequentially nesting a plurality of metal cylinders 52a, 52b and 52c one in one another. The gas supply pipe 5 is extended through the inner pipe 33a so as to be movable relative to the inner pipe 33a and the outer pipe 33b. Thus, the waveguide 33 can be moved vertically with the gas supply pipe 5 fixed.

A transparent plate 61 of, for example, quartz is fitted in an opening formed in the side wall of the vacuum vessel 1 and a cease level detector 62 for detecting the cease level (the lower limit level of a cease region) is disposed on the outer surface of the transparent plate 61. The cease level detector 62 may be an light sensor array of a plurality of light sensors vertically arranged with their optical axes extended horizontally. The light sensors corresponding to regions in which the plasma is luminescent are on and those corresponding to a cease region are off. Thus, a cease level can be detected by the cease level detector 62. A controller 63 receives a detection signal from the cease level detector 62 and a level signal from the lifting mechanism 4. The controller 63 finds the level of the antenna 32 on the basis of a pulse signal generated by an encoder connected to a motor included in the lifting mechanism 4. The controller 63 calculates a distance by which the antenna 32 must be vertically moved on the basis of the level of the antenna and the cease level and gives a control signal to the lifting mechanism 4 to move the antenna 32 by the calculated distance.

The operation of the plasma assisted processing system will be described. The proper size of a cavity for the microwave for processing a wafer W by a plasma-assisted process, such as a plasma-assisted film forming process for forming a polysilicon film on the wafer W, is determined beforehand.

As mentioned above, a cavity suitable for producing a plasma of uniform brightness may be determined through the observation of the plasma using the CCD camera. The cavity of the proper size is stored in the controller 63. The size of the cavity extends, on definition, between the antenna 32 and the level X0. Since the distance between the cease level and the level X0 is substantially fixed, storage of the proper distance H between the antenna 32 and the cease level is substantially equivalent to storage of the size of the cavity when the height of the antenna 32 is controlled through the detection of the cease level.

Figure 9:
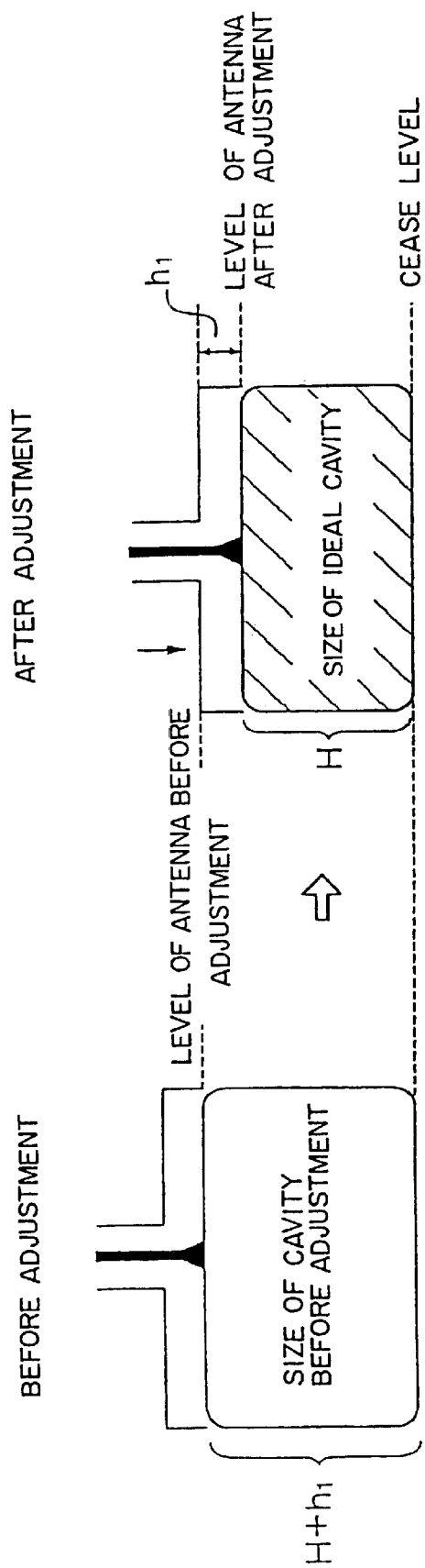
FIG. 9 is view of assistance in explaining a cavity for a microwave before and after the adjustment of the level of an antenna.

When processing a wafer W following a recipe, i.e., a set of process conditions including pressure, microwave power and such, a plasma is produced following the recipe and a cease level L0 is detected by the cease level detector 62 before actually processing the wafer W. The controller 63 gives a control signal to the lifting mechanism 4 to adjust the level of the antenna 32 so that the distance between the antenna 32 and the cease level L0 is adjusted to the distance H. FIG. 9 is a view of assistance in explaining the adjustment of the level of the antenna 32. If the height of a cavity, i.e., a region between the antenna 32 and the cease level L0, is H+h1, the height of the antenna 32 is reduced by h1 (the level X0 remains unchanged) to reduce the height of the cavity to H. As mentioned above, the level X1 of a cutoff density for the measuring microwave is detected by the same procedure, in which the distance between the antenna and the level X1 is H.

The cease level detector 62 and the controller 63 serve as a level estimating unit that estimates the level X0. When the electromagnetic wave radiator 97 and the electromagnetic wave receiver 98 shown in FIG. 5 are used for detecting the level X1, the electromagnetic wave radiator 97, the electromagnetic wave receiver 98 and the controller serve as a level estimating unit that estimates the level X0. Estimation of the level X0 includes using the cease level L0 or the detected level X1 in substitution for the level X0, and estimating the level X0 by using an algorithm on the basis of the cease level L0 or the detected level X1.

After the completion of the foregoing adjustment, a wafer W is carried into the vacuum vessel 1 and is mounted on the stage 2. Then, the vacuum vessel 1 is evacuated to a predetermined vacuum of, for example, $10^{-6}$ torr and monosilane ($SiH_4$) gas, i.e., a film forming gas, and Ar gas, i.e., a carrier gas, are supplied into the vacuum vessel 1. Subsequently, the microwave power unit 36 delivers plasma producing microwave power of, for example, 2.45 GHz and 2.5 kW and the bias power unit 21 applies bias power of, for example, 13.56 MHz and 1.5 kW to the stage 2.

The microwave generated by the microwave power unit 36 is guided for propagation by the waveguides 35 and 33 to the expanded part 34 and is propagated through the slots 31 of the antenna 32 into the vacuum vessel 1. The microwave ionizes the monosilane gas to produce active species, and the active species are deposited on a surface of the wafer W to form a polysilicon film.

When using another recipe, the level of the antenna is adjusted by the foregoing procedure before processing wafers W. The proper size H of the cavity is measure beforehand by using a processing gas to be used, such as monosilane gas. If the proper sizes of cavities for different gases are similar, the measured size may be used as the proper size H.

Since a plasma is produced so as to conform to the cavity of the proper size even if the recipe is changed, the plasma can be produced in a high uniformity at all times and the substrate can be processed in a high intrasurface uniformity, for example, to form a film of a uniform thickness on the wafer.

Figure 10:
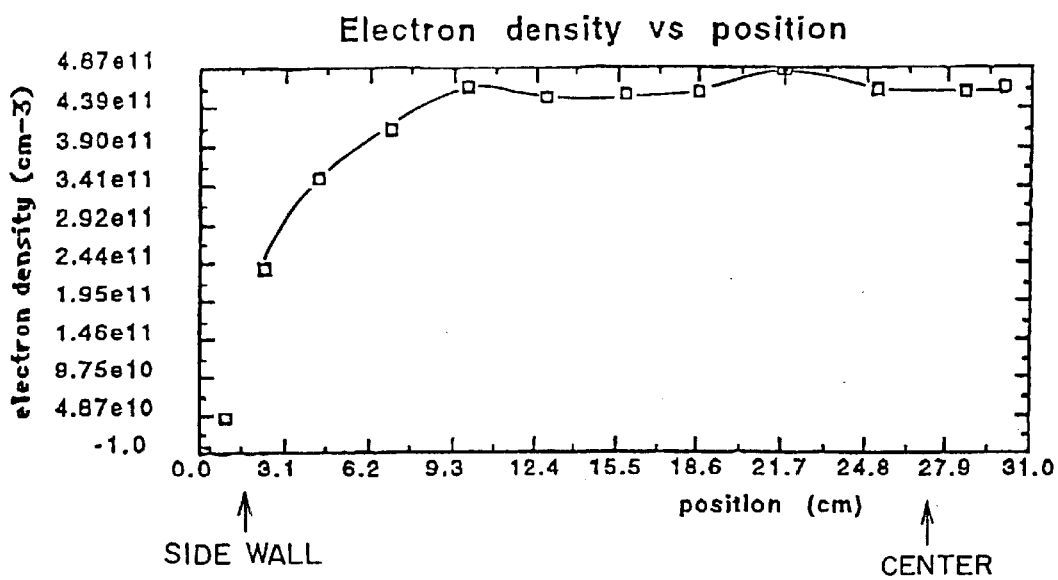
FIGS. 10, 11 and 12 are graphs showing electron density distributions in a processing vessel under different conditions.
Figure 11:
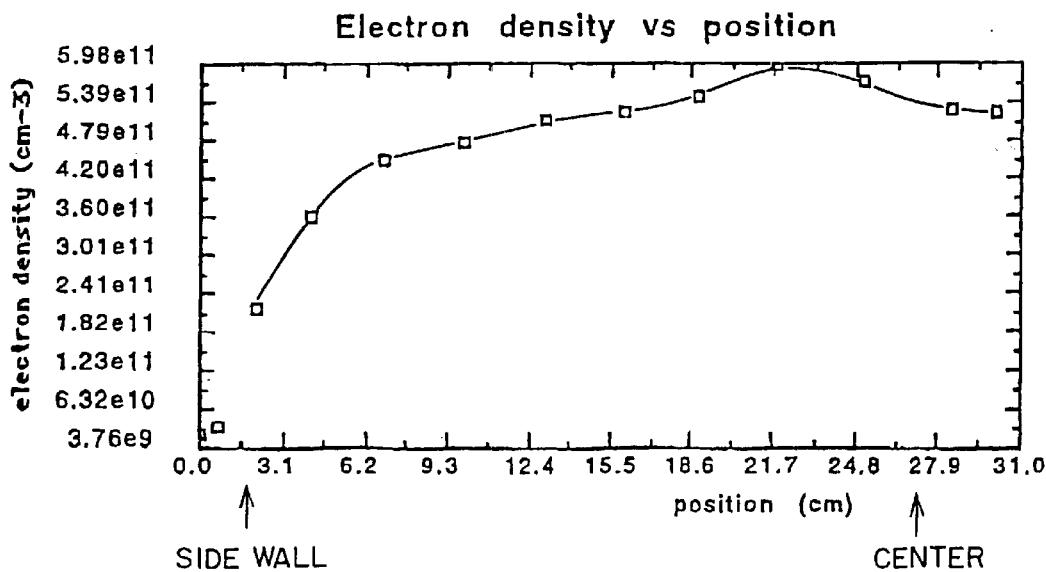
Figure 12:
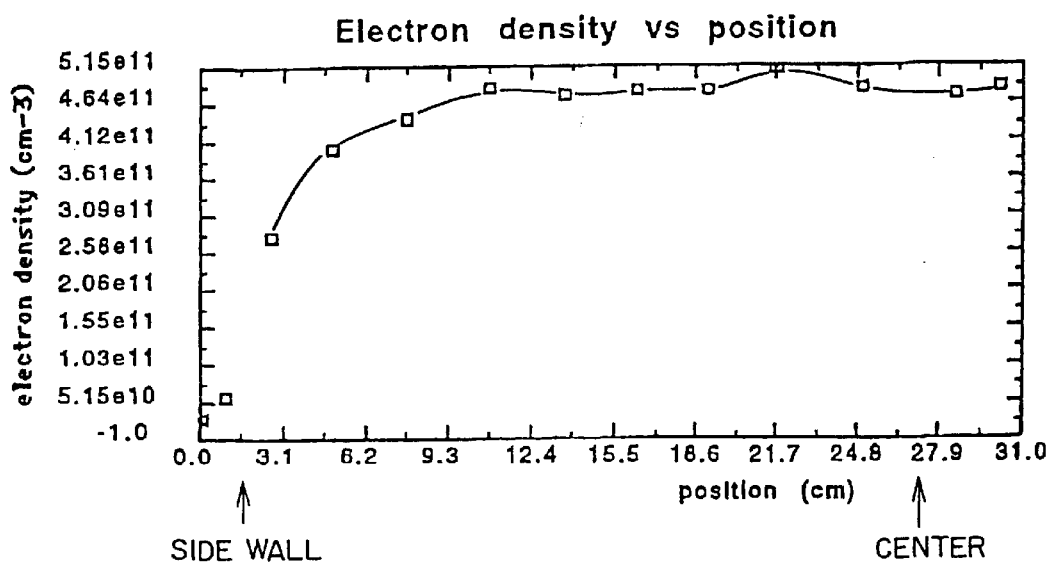

FIGS. 10 to 12 show the results of experiments conducted by using the plasma-assisted processing system shown in FIG. 7 to examine the effect of the level of the antenna 32 on electron density. In the experiments to obtain data shown in FIG. 10, Ar gas was supplied into the vacuum vessel 1 and the pressure in the vacuum vessel was adjusted to 30 mtorr (3.99 Pa), a plasma was produced by delivering 2.45 GHz, 2 kW microwave power by the microwave power unit 36 and applying 13.56 MHz, 1.5 kW bias power to the stage 2 by the bias power unit 21, and a region at 10.5 cm from the lower surface of the microwave transmitting plate 23 was scanned along a diameter of the vacuum vessel 1 with a probe to measure electron densities. In FIG. 10, distance from the side wall of the vacuum vessel 1 measured along the diameter of the vacuum vessel is measured on the horizontal axis and electron density is measured on the vertical axis. In FIG. 10, a point at 0.0 on the horizontal axis corresponds to a position on the side wall of the vacuum vessel and a point at 27.0 on the horizontal axis corresponds to the center of the vacuum vessel 1.

Experiments were conducted under conditions similar to those for the experiments to obtain data shown in FIG. 10, except that the pressure in the vacuum vessel 1 was adjusted to 50 mtorr (6.6 Pa) and date shown in FIG. 11 was obtained. As obvious from the comparative observation of FIGS. 10 and 11, the plasma produced at 50 mtorr is inferior in uniformity to that produced at 30 mtorr. The level of the antenna 32 was raised by 0.5 mm and similar experiments were conducted at 50 mtorr. Data shown in FIG. 12 was obtained. As obvious from FIG. 12, raising of the level of the antenna 32 was effective in improving the uniformity of the plasma.

The experimental results verified that the cease level rises, i.e., the cease level approaches the microwave transmitting plate 23, when the gas pressure is increased to increase the density of the plasma and hence a uniform plasma can be produced by raising the level of the antenna 32 to secure a proper distance between the antenna 32 and the plasma.

The vacuum vessel 1 may be moved vertically instead of moving the antenna 32. The plasma-assisted process may be an etching process or an ashing process. An RF power unit or a UHF power unit may be used for ionizing a processing gas instead of the microwave power unit. In this specification, microwave power units, RF power units and UHF power units are called inclusively high-frequency power units. A plasma may be produced by ionizing a processing gas by the electron cyclotron resonance of a microwave and a magnetic field.

Figure 13:
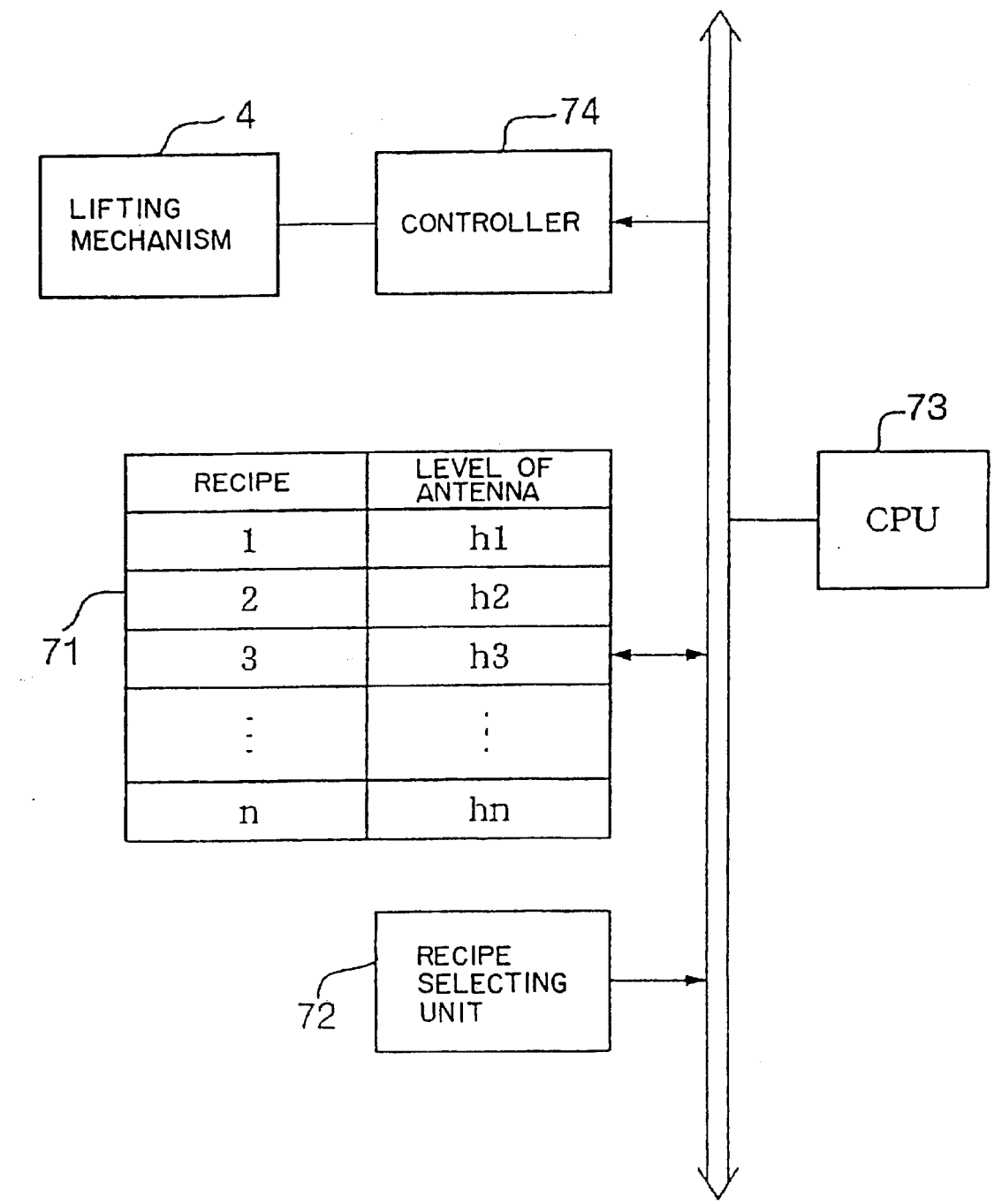
FIG. 13 is a block diagram of a control system included in a plasma-assisted processing system in a second embodiment according to the present invention.

According to the present invention, as shown in FIG. 13, levels of antenna 32 suitable for forming cavities of proper sizes for recipes may be determined and stored in a storage unit 71 beforehand, a CPU 73 may read a level of the antenna 32 for a recipe selected by a recipe selecting unit 72, a controller 74 may give a control signal to the lifting mechanism 4 to set the antenna 32 on the level read by the CPU 73. The proper level of the antenna 32 may be determined on the basis of the previously determined proper size H of the cavity by detecting a cease level for each recipe or may be determined by adjusting the level of the antenna 32 for each recipe observing the condition of the process. The antenna 32 may be vertically moved by a metal bellows extended between a peripheral part of the antenna 32 and a peripheral part of the microwave transmitting plate 23.

Figure 14:
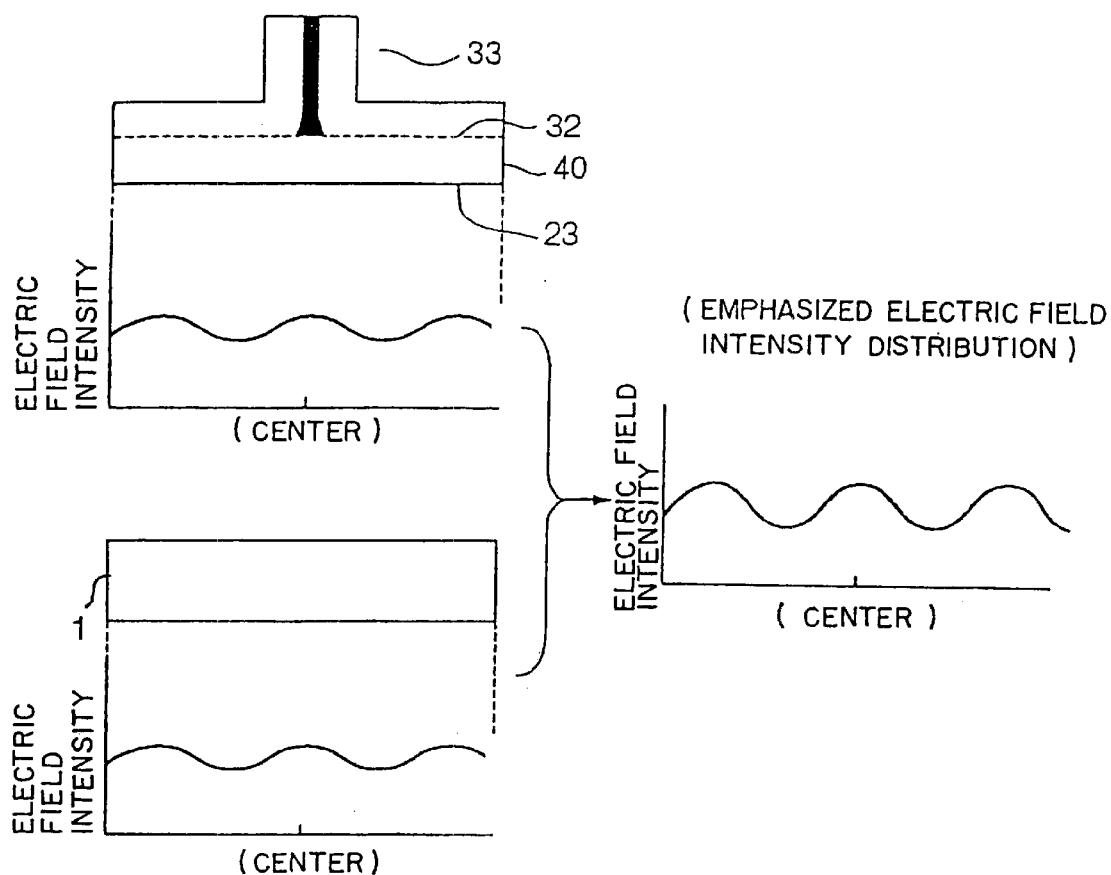
FIG. 14 is a typical view of assistance in explaining the resonance of electric field intensity distributions respectively over and under a microwave transmitting plate.
Figure 15A:
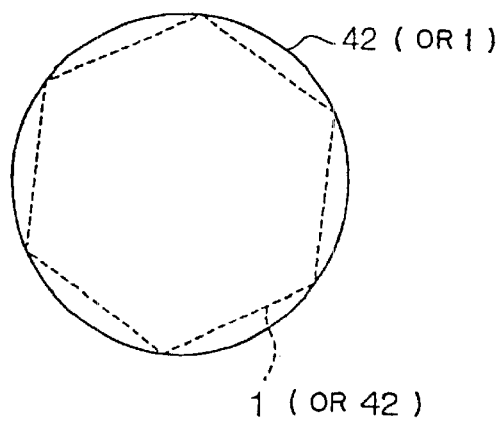
FIGS. 15A and 15B are views of assistance in explaining the shape of a cross section of a wall between an upper part of a microwave transmitting plate and a vacuum chamber.
Figure 15B:
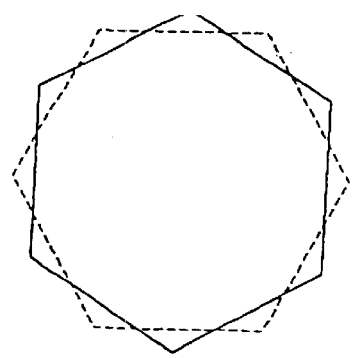

There is the possibility that an electric field intensity distribution in the vacuum vessel 1 caused by a cavity surrounded by a wall part 40 extending between the antenna 32 and the microwave transmitting plate 23 and an electric field intensity distribution caused by a cavity in the vacuum vessel 1 are emphasized as shown in FIG. 14 when both a wall part corresponding to the electromagnetic wave shielding member 42 and the vacuum vessel 1 are cylindrical. Therefore, the wall part 40 and the antenna 32 may be formed respectively in shapes having hexagonal cross sections and the vacuum vessel 1 may be formed in a cylindrical shape having a circular cross section, or the wall part 40 and the antenna 32 may be formed respectively in cylindrical shapes and the vacuum vessel 1 may be formed in a shape having a polygonal cross section as shown in FIG. 15A. Both the vacuum vessel 1 and the electromagnetic shielding cylinder 42 may be formed respectively in shapes having n-sided polygonal cross sections (in FIG. 6, hexagonal cross sections) and may be disposed with the corners thereof circumferentially dislocated relative to each other as shown in FIG. 15B. The vacuum vessel 1 and the electromagnetic shielding cylinder 42 may be formed respectively in shapes having special curvilinear cross sections other than polygonal cross sections. When the wall part 40 and the vacuum vessel 1 are formed in shapes having different cross sections, respectively, the wall part 40 and the vacuum vessel 1 have different microwave modes, respectively, whereby the emphasis of the electric field intensity distribution can be reduced or avoided and the uniformity of the plasma can be improved.

As apparent from the foregoing description, according to the present invention, a highly uniform plasma can be produced and a substrate can be processed in a high intra-surface uniformity.

What is claimed is:

1. A plasma-assisted processing system including a vacuum vessel internally provided with a stage, a high-frequency wave transmitting plate attached to the vacuum vessel, a planar antenna disposed opposite to the high-frequency wave transmitting plate, and a high-frequency power unit that delivers a high-frequency wave for producing a plasma to the antenna, wherein the plasma-assisted processing system propagates a high-frequency wave for producing a plasma through the antenna and the high-frequency wave transmitting plate into the vacuum vessel, produces a plasma by ionizing a processing gas supplied into the vacuum vessel by the energy of the high-frequency wave and processes a substrate mounted on the stage in the vacuum vessel by using the plasma;

said plasma-assisted processing system comprising:
a lifting mechanism that moves the antenna vertically relative to the vacuum vessel;
an electromagnetic shielding member surrounding a region between the antenna and the high-frequency wave transmitting plate;
a level estimating unit that estimates a level of high-frequency wave cutoff density formed between the high-frequency wave transmitting plate and a plasma producing region; and
a controller that controls the lifting mechanism to adjust the level of the antenna so that a cavity of a proper size for the high-frequency wave is formed between the antenna and the level of a cutoff density for the high-frequency wave for producing a plasma.

2. The plasma-assisted processing system according to claim 1, wherein the level estimating unit includes:
a transparent plate formed in a side wall of the vacuum vessel; and
a cease region detecting unit optically detecting a lower limit level of a cease region of a plasma produced between the high-frequency wave transmitting plate and a region in which the plasma is luminescent, and
wherein a level for the cutoff density is estimated on the basis of a detected lower limit level of the cease region for the plasma.

3. The plasma-assisted processing system according to claim 1, wherein the level estimating unit includes
a high-frequency wave radiating unit that delivers a detecting high-frequency wave from above the plasma to the plasma, and
a high-frequency wave receiving unit that receives the detecting high-frequency wave delivered and reflected by the plasma;
wherein a level of the cutoff density for the detecting high-frequency wave is determined on the basis of the position of the reflected high-frequency wave on the high-frequency wave receiving unit, and a level of the cutoff density for high-frequency wave producing the plasma is estimated on the basis of the level of the cutoff density for the detecting high-frequency wave.

* * * * *